(12) United States Patent
Zhang

(10) Patent No.: US 10,066,791 B2
(45) Date of Patent: Sep. 4, 2018

(54) SPIRAL LED FILAMENT AND LIGHT BULB USING SPIRAL LED FILAMENT

(71) Applicant: Tiehan Ge, Hangzhou (CN)

(72) Inventor: Xiaofeng Zhang, Yuyao (CN)

(73) Assignee: TIEHAN GE, Hangzhou (CN)

( * ) Notice: Subject to any disclaimer, the term of this patent is extended or adjusted under 35 U.S.C. 154(b) by 0 days.

(21) Appl. No.: 15/039,739

(22) PCT Filed: Nov. 27, 2014

(86) PCT No.: PCT/CN2014/092330
§ 371 (c)(1),
(2) Date: May 26, 2016

(87) PCT Pub. No.: WO2015/081804
PCT Pub. Date: Jun. 11, 2015

(65) Prior Publication Data
US 2016/0377237 A1     Dec. 29, 2016

(30) Foreign Application Priority Data

Dec. 2, 2013   (CN) .......................... 2013 1 0639668
Dec. 2, 2013   (CN) ..................... 2013 2 0777826 U

(51) Int. Cl.
| | |
|---|---|
| *F21V 5/00* | (2018.01) |
| *F21K 9/232* | (2016.01) |
| *F21K 9/238* | (2016.01) |
| *F21K 9/237* | (2016.01) |
| *F21V 3/02* | (2006.01) |

(Continued)

(52) U.S. Cl.
CPC .............. *F21K 9/232* (2016.08); *F21K 9/237* (2016.08); *F21K 9/238* (2016.08); *F21V 3/02* (2013.01); *F21V 19/005* (2013.01); *F21V 23/005* (2013.01); *F21V 23/06* (2013.01); *H01L 27/15* (2013.01); *H01L 33/20* (2013.01); *H01L 33/54* (2013.01); *H01L 33/56* (2013.01);

(Continued)

(58) Field of Classification Search
CPC . F21K 9/232; F21K 9/238; F21V 3/02; F21V 19/005; F21V 23/005; F21V 23/06; H01L 33/20; H01L 33/54; H01L 33/56; H01L 33/62; F21Y 2107/00; F21Y 2115/10
USPC ........................................ 362/311.02, 311.06
See application file for complete search history.

(56) References Cited

U.S. PATENT DOCUMENTS

| | | | | |
|---|---|---|---|---|
| 4,439,818 | A * | 3/1984 | Scheib ................ | F21V 21/0808 362/221 |
| 5,746,500 | A * | 5/1998 | Chien ................. | A43B 1/0036 36/137 |

(Continued)

*Primary Examiner* — Paultep Savusdiphol
(74) *Attorney, Agent, or Firm* — Anova Law Group, PLLC

(57) ABSTRACT

A spiral LED packaging filament comprises a substrate, a plurality of LED chips disposed on the top surface of the substrate, a medium layer sealing the plurality of LED chips and the top surfaces of the substrate into a sealed LED package; two electrode wires being electric connected to the plurality of LED chips, wherein the sealed LED package has a spiral shape. A light bulb with the spiral LED packaging filament comprises a bulb shell; a stem having a supporting pole, an electrical wire and a stem exhaust pipe, at least one spiral LED packaging filament is fixed on the stem; the electrode wire is connected to the electrical connector via the drive; and the bulb shell and the stem are respectively sealed.

18 Claims, 4 Drawing Sheets

(51) Int. Cl.
 *F21V 19/00* (2006.01)
 *F21V 23/00* (2015.01)
 *F21V 23/06* (2006.01)
 *H01L 27/15* (2006.01)
 *H01L 33/20* (2010.01)
 *H01L 33/54* (2010.01)
 *H01L 33/56* (2010.01)
 *H01L 33/62* (2010.01)
 *F21Y 115/10* (2016.01)
 *F21Y 107/00* (2016.01)

(52) U.S. Cl.
 CPC .......... *H01L 33/62* (2013.01); *F21Y 2107/00* (2016.08); *F21Y 2115/10* (2016.08); *H01L 2924/0002* (2013.01)

(56) References Cited

U.S. PATENT DOCUMENTS

| | | | |
|---|---|---|---|
| 6,371,637 B1 * | 4/2002 | Atchinson | F21V 19/005 362/249.04 |
| 7,354,174 B1 * | 4/2008 | Yan | F21V 23/005 313/512 |
| 2003/0031015 A1 * | 2/2003 | Ishibashi | F21V 3/00 362/235 |
| 2004/0007981 A1 * | 1/2004 | Shibata | F21K 9/232 315/56 |
| 2004/0136205 A1 * | 7/2004 | Peng | A01K 27/006 362/570 |
| 2005/0162850 A1 * | 7/2005 | Luk | H05B 33/0857 362/227 |
| 2007/0291473 A1 * | 12/2007 | Traynor | A01K 11/00 362/106 |
| 2010/0097791 A1 * | 4/2010 | Chang | A42B 1/244 362/190 |
| 2011/0050073 A1 * | 3/2011 | Huang | F21K 9/00 313/46 |
| 2012/0169251 A1 * | 7/2012 | Lai | F21K 9/90 315/294 |
| 2013/0099685 A1 * | 4/2013 | Zhang | H05B 33/0842 315/186 |
| 2013/0107514 A1 * | 5/2013 | McNabb | F21V 21/00 362/231 |

* cited by examiner

SPIRAL LED FILAMENT AND LIGHT BULB USING SPIRAL LED FILAMENT

RELATE APPLICATIONS

This application is a national phase entrance of and claims benefit to PCT Application PCT/CN2014/092330, filed on Nov. 27, 2014, which claims benefit to Chinese Patent Applications 201310639668.6 and 201320777826.X, both filed on Dec. 2, 2013. The specifications of both applications are incorporated here by this reference.

FIELD OF THE INVENTION

The present invention relates to an LED packaging filament and a light bulb, in particular to a spiral LED packaging filament in strip, replacing a tungsten filament in an incandescent lamp, and a light bulb using the spiral filament, belonging to the field of general illumination and decorative illumination.

DESCRIPTION OF THE PRIOR ART

In the prior art, an LED is generally packaged in the following forms: Lamp-LED, SMD-LED, Side-LED, TOP-LED, High-Power-LED, and Flip Chip-LED, and the packaging forms described above are substantially point packaging and have the following disadvantages of discontinuous light sensing during the application, shortcomings in light distribution design, and incapability of emitting light at multiple angles and in multiple levels.

At present, there are two main solutions for a bulb-type LED lamp. In one solution, the bulb-type LED lamp mostly consists of a plurality of LEDs, an MPCB (Metal-based Print Circuit Board), a heat dissipation device with a series of heat dissipation fins, a drive including a switching power supply and a constant current device and a housing thereof, an anti-glaring bulb shell and an electrical connector. At present, the light-emitting angle of such lamps is restricted by the heat dissipation device, and during the application, the light-emitting angle imposes influence on many application occasions.

In the other solution of the bulb-type LED lamp, multiple LED chips are bonded and lined on a linear strip-shaped transparent substrate, and the surroundings thereof are covered with luminescent material of fluorescent powder, then a linear strip-shaped LED filament is formed and emits light at a $4\pi$ stereoscopic angle; and then, at least one linear strip-shaped LED filament is connected onto a stem disposed inside a bulb shell; when a circuit drive is added following the sealing and exhausting process, a whole lamp is manufactured completely. The light-emitting mode of such a bulb lamp is similar to that of a tungsten filament lamp. However, at present, such a bulb-type LED lamp is complicated in manufacturing process and low in manufacturing efficiency. It is alleged, in such a bulb-type LED lamp, the light can emit at a $4\pi$ stereoscopic angle. In fact, since the light cannot be emitted from the two packaged ends of each linear strip-shaped LED filament, although the four linear strip-shaped LED filaments can be arranged at a certain rotation angle, such a solution has restricted improvement effect. When using, a dark zone can be easily formed on the top of the light bulb, thus leading to a disqualified light distribution curve.

SUMMARY OF THE INVENTION

A first technical problem to be solved by the present invention is to provide a spiral LED packaging filament, by which all the LEDs can stereoscopically emit light at multiple-angles and in multiple levels through a spiral body, thus to provide a more all-sided illumination light source. A second technical problem to be solved is to provide a light bulb with a spiral LED packaging filament, by which all the LEDs can stereoscopically emit light at multiple-angles and in multiple levels through a spiral body, thus to provide a more all-sided illumination light source.

To solve the first technical problem, the spiral LED packaging filament, comprises a substrate with a top surface and two ends; a plurality of LED chips each connected in series or in parallel are disposed on the top surface of the substrate; a medium layer sealing the plurality of LED chips and the top surfaces of the substrate into a sealed LED package; two electrode wires, each electrode wire being extending out from one end of the substrate, two electrode wires being electric connected to the plurality of LED chips, wherein the sealed LED package having a spiral shape.

Preferably, the substrate has a conical spiral shape or a regular spiral shape.

Preferably, the LED chips are attached onto the substrate through transparent adhesive or conducting adhesive.

Preferably, the transparent adhesive and/or the conducting adhesive is selected from a group consisting of silica gel, a modified resin adhesive, an epoxy resin adhesive, silver colloid and a copper adhesive.

Preferably, the substrate is made from material selected from a group consisting of metal, organic glass, plastic material and silica gel, all of which can be molding secondarily.

Preferably, the plurality of LED chips has a same color or different colors.

Preferably, the medium layer is made from material selected from a group consisting of silica gel, an epoxy resin adhesive and an LED luminescent powder adhesive.

Preferably, the electrode wires are fixed at the two ends of the substrate through glue, a ceramic adhesive, low-melting-point glass, silver paste or plastic material, and a connection member is disposed between each electrode wire and a corresponding end of the substrate.

To solve the second technical problem, a light bulb with the spiral LED packaging filament is also provided. The light bulb with the spiral LED packaging filament comprises a bulb shell; a stem having a supporting pole, an electrical wire and a stem exhaust pipe; an electrical connector; and a drive; wherein, at least one spiral LED packaging filament is fixed on the stem; the electrode wire is connected to the electrical connector via the drive; and the bulb shell and the stem are respectively sealed.

Preferably, a plastic bulb assembly is provided between the bulb shell and the electrical connector.

Preferably, the spiral LED packaging filament comprises a substrate with a top surface and two ends; a plurality of LED chips each connected in series or in parallel are disposed on the top surface of the substrate; a medium layer sealing the plurality of LED chips and the top surfaces of the substrate into a sealed LED package; two electrode wires, each electrode wire being extending out from one end of the substrate, two electrode wires being electric connected to the plurality of LED chips, the sealed LED package has a spiral shape.

Preferably, the substrate has a conical spiral shape or a regular spiral shape.

Preferably, the LED chips are attached onto the substrate through transparent adhesive or conducting adhesive, and the transparent adhesive and/or the conducting adhesive is selected from a group consisting of silica gel, a modified resin adhesive, an epoxy resin adhesive, silver colloid and a copper adhesive.

Preferably, the substrate is made from material selected from a group consisting of metal, organic glass, plastic material and silica gel, all of which can be molding secondarily.

Preferably, the plurality of LED chips has a same color or different colors.

Preferably, the medium layer is made from material selected from a group consisting of silica gel, an epoxy resin adhesive and an LED luminescent powder adhesive.

Preferably, the electrode wires are fixed at the two ends of the substrate through glue, a ceramic adhesive, low-melting-point glass, silver paste or plastic material, and a connection member is disposed between each electrode wire and a corresponding end of the substrate.

Preferably, the at least one spiral LED packaging filament operates with two-phase AC or single-phase DC; when the at least one spiral LED packaging filament is connected to operate with single-phase DC, an external DC power supply or an external AC power supply can be used.

The bulb shell can be a transparent shell, or a milky white, frosted, colored shell, and can also be a shell having a reflecting layer in a portion thereof or a series of small prisms and small lens in a portion thereof.

The shape of the bulb shell can be one of A-type, G-type, R-type, PAR-type, T-type, candle-type or other shapes of existing bulbs.

The electrical connector can be one of electrical connectors of the existing bulbs, for example, E40, E27, E26, E14 and GU.

Compared with the prior art, in the present invention, the discontinuous light of point LED packaging in an actual using in the prior art is overcome, and the shortcomings in light distribution design of linear strip-shaped LED packaging in an actual using are also overcome; in the present invention, all the LEDs can stereoscopically emit light at multiple-angles and in multiple levels through the spiral substrate. In the present invention, the light distribution design of lamps during the actual application can be improved, and the manufacturing process for the light bulb can meanwhile be simplified.

BRIEF DESCRIPTION OF THE DRAWINGS

FIG. 1-1 is a front view of FIG. 1;

FIG. 1-2 is a side view of FIG. 1;

FIG. 2 is a perspective view of a spiral LED packaging filament according to a second embodiment of the present invention;

FIG. 2-1 is a front view of FIG. 2;

FIG. 2-2 is a side view of FIG. 2;

The reference numbers and the corresponding component names are listed as follows: 1—electrode wire; 2—substrate; 3—medium layer; 4—connection member; 5—LED chips; 6—electrical connection wire between two adjacent LED chips; 21—bulb shell; 22—spiral LED packaging filament; 23—supporting pole of a stem; 24—electrical wire; 25—metal filament for fixation; 26—stem exhaust pipe; 27—plastic bulb assembly; 28—electrical wire for a drive; 29—drive; 30—electrical connector.

DETAILED DESCRIPTION OF THE PREFERRED EMBODIMENT

Figure 1:
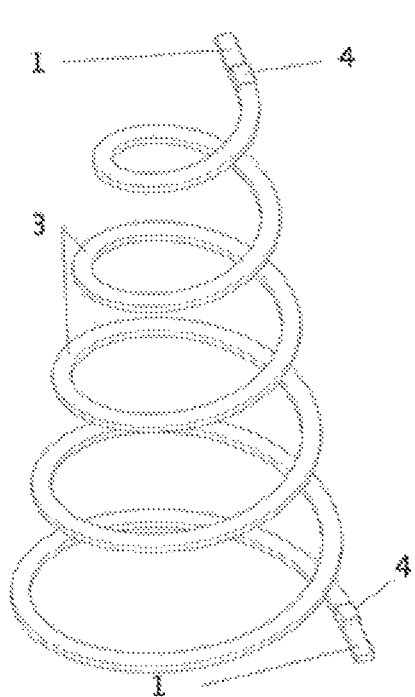
FIG. 1 is a perspective view of a spiral LED packaging filament according to a first embodiment of the present invention.
Figure 1:
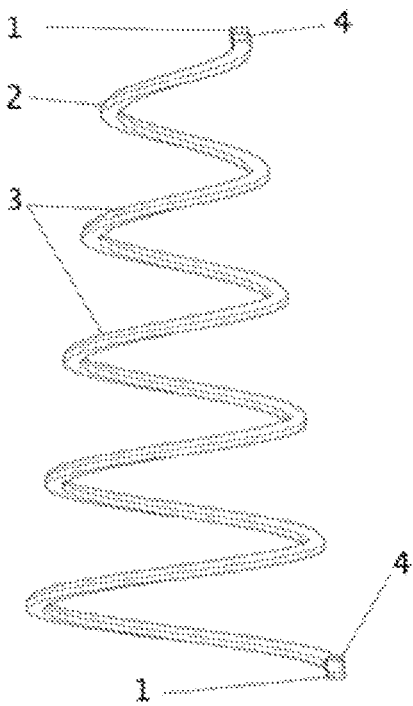

To enable a further understanding of the present invention content of the invention herein, refer to the detailed description of the invention and the accompanying drawings below:

As shown in FIG. 1, a spiral LED packaging filament of the present invention comprises a substrate 2; plural LED chips 5 are provided on the substrate 2; the LED chips are attached onto the substrate 2 through transparent adhesive or conducting adhesive, which is selected from a group consisting of silica gel, a modified resin adhesive, an epoxy resin adhesive, silver colloid and a copper adhesive; each LED chip is connected to each other in series or in parallel by electrical connection wire between two adjacent LED chips 6; and a medium layer 3 with a protection or light-emitting function is coated on surfaces of the substrate and the LED chips. Two electrode wires 1, each electrode wire 1 extends out from one end of the substrate, two electrode wires are electric connected to the plurality of LED chips 5; electrode wires 1 and the substrate 2 are fixed at the two ends of the substrate 2 through glue, a ceramic adhesive, low-melting-point glass, silver paste or plastic material, and a connection member 4 is disposed between each electrode wire 1 and a corresponding end of the substrate 2.

With regard to the substrate 2 of the spiral LED packaging filament, the material thereof is not limited to metal, organic glass, PVC, plastic material or silica gel. There are two methods for manufacturing the substrate 2. One method is: first, LED chips are flatly packaged; after the packaging process, the packaged filament is three-dimensionally shaped secondarily by methods such as stretching, extruding, die shaping, and anchoring, as shown in FIG. 1. The other method is: first, a spiral body is shaped, and then LEDs are three-dimensionally packaged.

The LED chips 5, which are connected in series or in parallel and are disposed on the substrate 2, can be completely the same, partially the same or completely different. The LED chips have same color or different colors. For example, light with same colors can be blue light, ultraviolet light, and other monochromatic light, and can be light of different colors so that mixed light of different colors can be obtained. By selecting a different number of LEDs emitting light of various colors, white light with a high color rendering index can also be obtained.

Figures 1, 2:
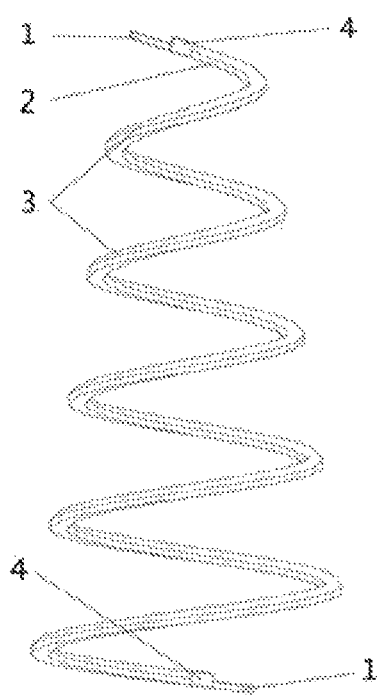
Figure 2:
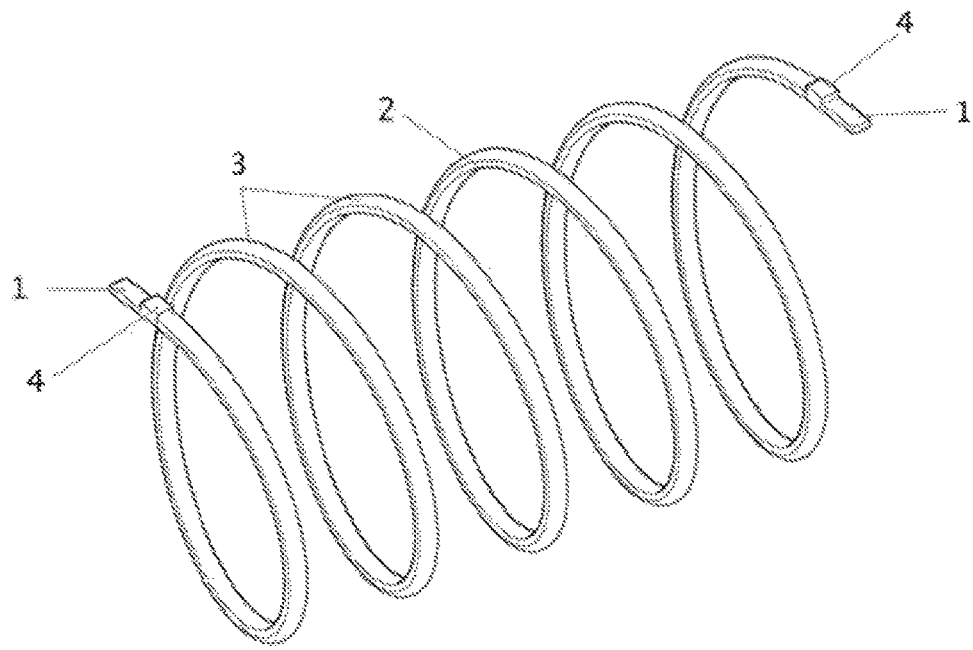
Figures 1, 2:
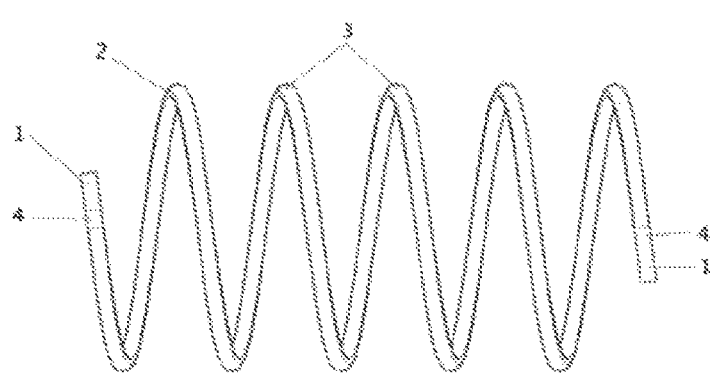
Figure 2:
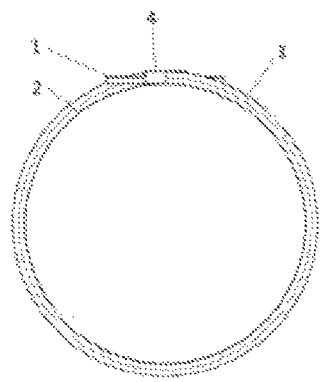

FIG. 1-1 and FIG. 1-2 are a front view and a side view of FIG. 1, showing the structure of the first embodiment of a spiral LED packaging filament of the present invention. The relation between members can be seen from a different perspective.

Figures 3, 3A:
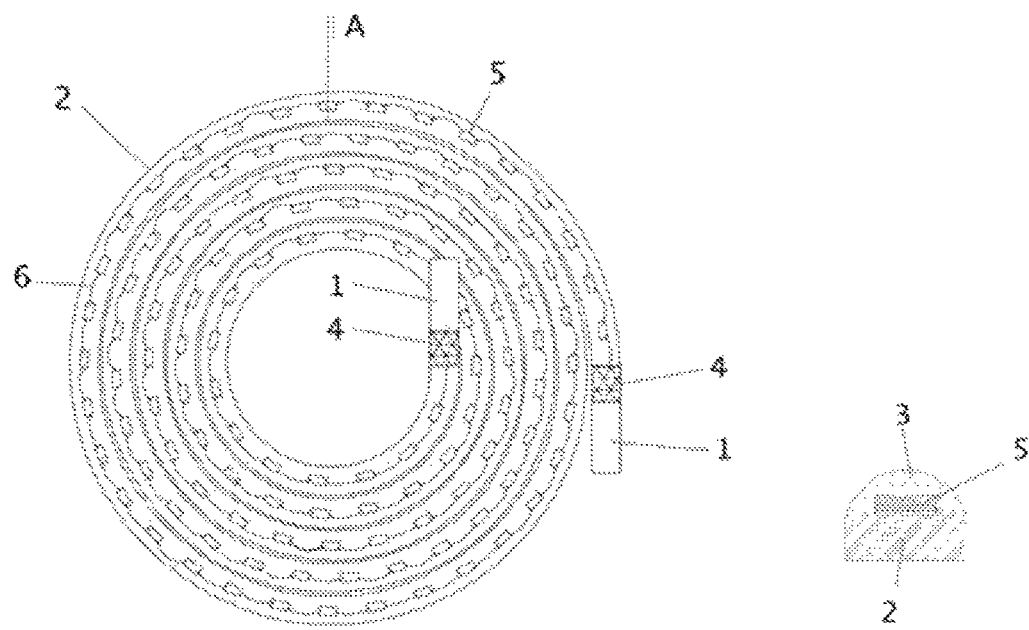
FIG. 3 is a top view of FIG. 1 showing an interior structure of the spiral LED packaging filament according to the first embodiment of the present invention.
FIG. 3A is a sectional view of Part-A of FIG. 3.

FIG. 3 is a top view of FIG. 1 showing an interior structure of the spiral LED packaging filament according to the first embodiment of the present invention. FIG. 3A is a sectional view of Part-A of FIG. 3. The medium layer 3 is a medium layer which is disposed on top surfaces of the substrate of the spiral LED packaging filament and the chips and has a protection or light-emitting function; and the medium layer is made from material selected from a group consisting of silica gel, an epoxy resin adhesive and an LED luminescent powder adhesive.

Embodiment 1

FIG. 1 shows a perspective view of the spiral LED packaging filament according to the first embodiment of the present invention, in this embodiment, the filament has a conical spiral shape.

Embodiment 2

FIG. 2 shows a perspective view of a spiral LED packaging filament according to the second embodiment of the present invention, in this embodiment, the upper portion and the lower portion (or the left portion and the right portion) of the filament has a regular spiral shape. The manufacturing method is as follows: first, linear strip-shaped LEDs are packaged, and then are spirally reshaped by a mold following the packaging process.

FIG. 2-1 and FIG. 2-2 are respectively a front view and a side view of FIG. 1, showing the structure of the second embodiment of the spiral LED packaging filament of the present invention. The connection relation between members can be seen from a different perspective.

Figures 4, 5:
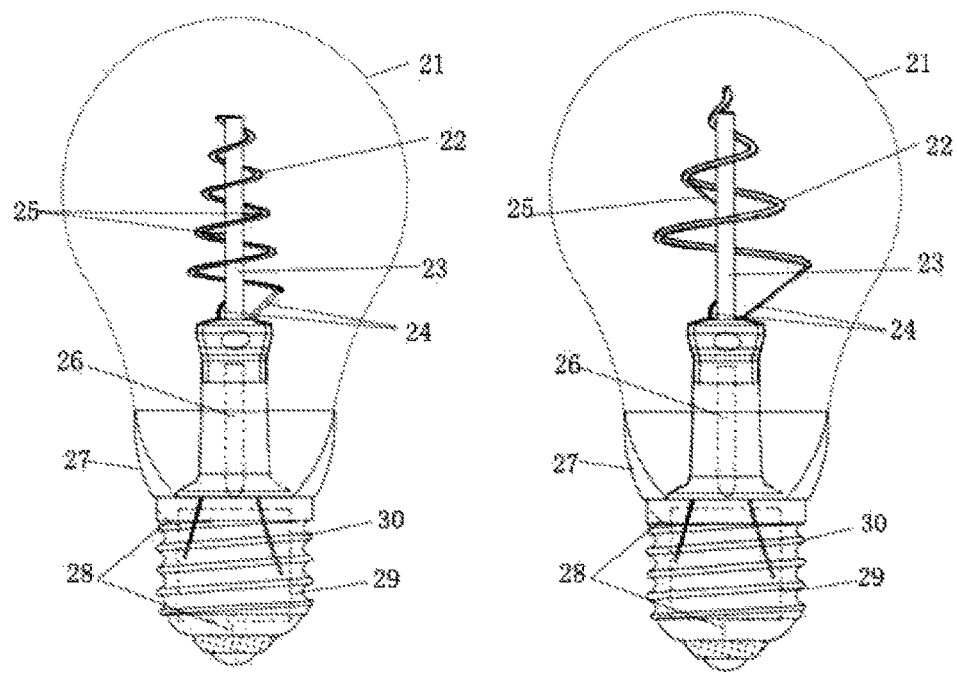
FIG. 4 is a perspective view of a light bulb using a spiral LED packaging filament according to a first embodiment of the present invention.
FIG. 5 is a perspective view of a light bulb using a spiral LED packaging filament according to a second embodiment of the present invention.

FIG. 4 shows a light bulb using a spiral LED packaging filament of a first embodiment. In this embodiment, the light bulb comprises a transparent bulb shell 21, a stem disposed inside the bulb shell 21 having a supporting pole 23, an electrical wire 24 and a stem exhaust pipe 26. At least one spiral LED packaging filament is fixed on the supporting pole 23 by a metal wire 25, the electrode wire 1 thereof is connected to the electrical connector 30 via the electrical wire 24, a drive 29 and an electrical wire for a drive 28 in order to connect with and turn on an external power supply, and thus the spiral LED packaging filament 22 can be lightened up; and the bulb shell 21, and the supporting pole 23, the electrical wire 24 and the core stem exhaust pipe 26, are respectively sealed.

With regard to the substrate 2 of the spiral LED packaging filament, the material thereof is not limited to metal, organic glass, PVC, plastic material or silica gel. There are two methods for manufacturing the substrate 2. One method is: first, LED chips are flatly packaged; after the packaging process, the packaged filament is three-dimensionally shaped secondarily by methods such as stretching, extruding, die shaping, and anchoring. The other method is: first, a spiral body is shaped, and then the LEDs are three-dimensionally packaged, supported by the stem, located on the stem after being shaped.

A plastic assembly 27 is provided between the bulb shell 21 and the electrical connector 30.

The bulb shell 21 is a transparent shell, or a milky white, frosted, colored shell, and can also be a shell having a reflecting layer in a portion thereof or a series of small prisms and small lens in a portion thereof. The shape of the transparent bulb shell 21 can be one of A-type, G-type, R-type, PAR-type, T-type, candle-type or other shapes of existing bulbs. The electrical connector 10 can be one of electrical connectors of the existing bulbs, for example, E40, E27, E26, E14 and GU.

The spiral LED packaging filament 2 can be connected to operate with two-phase AC or single-phase DC. When the spiral LED packaging filament 2 is connected to operate with a single-phase DC, an external DC power supply or an alternating current power supply can be used. When the external alternating current power supply is used, the drive can be formed of a voltage reducing and current limiting circuit in which a capacitor and a resistor are connected in parallel, and a rectifier filter circuit; the drive circuit is simple, low in cost, and free from any electrolytic capacitor, any triode, any transformer and any high-frequency radiation, and can also be a switching power supply and a constant current device.

Figure 6:
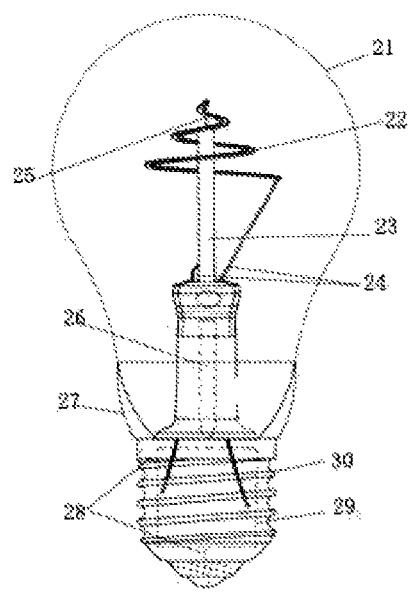
FIG. 6 is a perspective view of a light bulb using a spiral LED packaging filament according to a third embodiment of the present invention.
Figure 7:
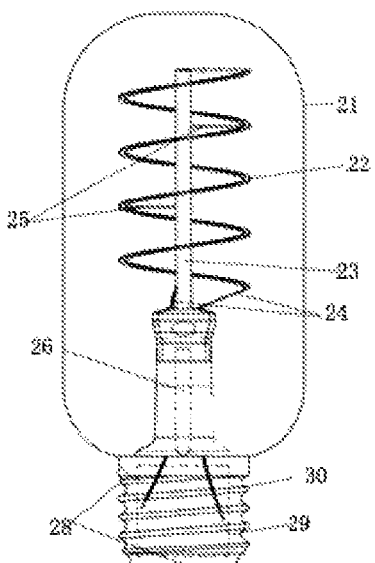
FIG. 7 is a perspective view of a light bulb using a spiral LED packaging filament according to a fourth embodiment of the present invention.
Figure 8:
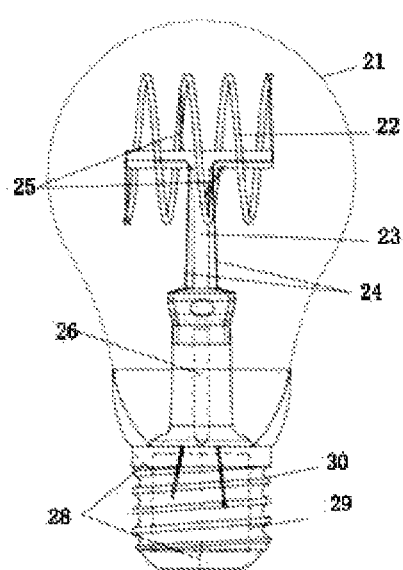
FIG. 8 is a perspective view of a light bulb using a spiral LED packaging filament according to a fifth embodiment of the present invention.
Figure 9:
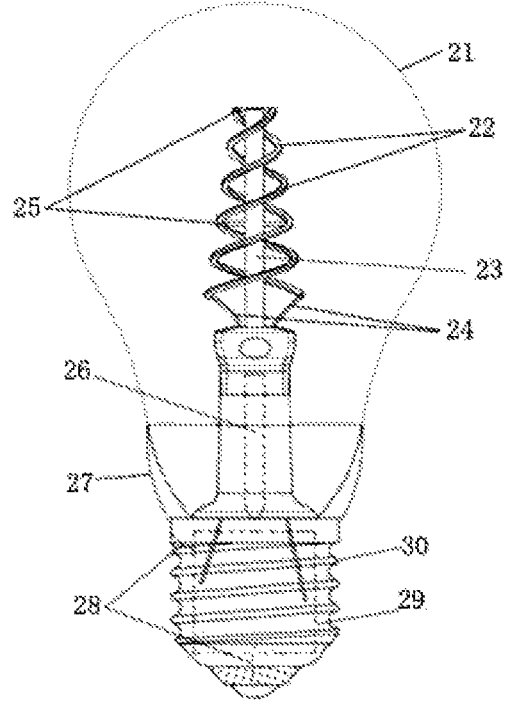
FIG. 9 is a perspective view of a light bulb using a spiral LED packaging filament according to a sixth embodiment of the present invention.

As shown in FIG. 4, in the first embodiment of the light bulb, the LED packaging filament has a conical spiral shape, and the holder of the bulb is E-type. FIG. 5 shows the second embodiment of the light bulb, in this embodiment, the shape of the spiral LED packaging filament 22 is different from that in FIG. 1. FIG. 6 shows the third embodiment of the light bulb, in this embodiment, the shape of the spiral LED packaging filament 22 is different from that in both FIG. 4 and FIG. 5. FIG. 7 shows the fourth embodiment of the light bulb, in this embodiment, the bulb shell is one of a series of antique lamps (also called classical lamps), and meanwhile, the plastic bulb assembly 27 for a bulb is omitted; and in terms of shape, the spiral LED packaging filament 22 has a regular spiral shape. FIG. 8 shows the fifth embodiment of the light bulb, in this embodiment, the spiral LED packaging filament 22 has a regular spiral shape, and meanwhile, the filament are arranged in a transverse direction. FIG. 9 shows the sixth embodiment of the light bulb, in this embodiment, there are two spiral LED packaging filaments 22 to form a dual spiral body.

The protection scope of the present invention is not limited to each embodiments described in this description. Any changes and replacements made on the basis of the scope of the present invention patent and of the description shall be included in the scope of the present invention patent.

The invention claimed is:
1. A spiral LED packaging filament, comprising:
   a substrate with a top surface and two ends;
   a plurality of LED chips each connected in series or in parallel disposed on the top surface of the substrate;
   a medium layer sealing the plurality of LED chips and the top surface of the substrate into a sealed LED package;
   two electrode wires, each electrode wire being extending out from one end of the substrate, two electrode wires being electrically connected to the plurality of LED chips,
   wherein the plurality of LED chips are flatly packaged, and the sealed LED package is three-dimensionally shaped secondarily by a method selected from a group consisting of stretching, extruding, and die shaping to form the spiral LED packaging filament, and
   the sealed LED package has a spiral shape.
2. The spiral LED packaging filament of claim 1, wherein the substrate has a conical spiral shape or a regular spiral shape.

3. The spiral LED packaging filament of claim 1, wherein the LED chips are attached onto the substrate through transparent adhesive or conducting adhesive.

4. The spiral LED packaging filament of claim 3, wherein the transparent adhesive and/or the conducting adhesive is selected from a group consisting of silica gel, a modified resin adhesive, an epoxy resin adhesive, silver colloid and a copper adhesive.

5. The spiral LED packaging filament of claim 1, wherein the substrate is made from a material selected from a group consisting of metal, organic glass, plastic material and silica gel, all of which can be molding secondarily.

6. The spiral LED packaging filament of claim 1, wherein the plurality of LED chips have same color or different colors.

7. The spiral LED packaging filament of claim 1, wherein the medium layer is made from a material selected from a group consisting of silica gel, an epoxy resin adhesive and an LED luminescent powder adhesive.

8. The spiral LED packaging filament of claim 1, wherein the electrode wires are fixed at the two ends of the substrate through glue, a ceramic adhesive, low-melting-point glass, silver paste or plastic material, and a connection member is disposed between each electrode wire and a corresponding end of the substrate.

9. A light bulb, comprising:
a bulb shell;
a stem having a supporting pole, an electrical wire and a stem exhaust pipe;
a spiral LED packaging filament fixed on the stem;
an electrical connector; and
a drive;
wherein:
the spiral LED packaging filament comprises:
a substrate with a top surface and two ends,
a plurality of LED chips each connected in series or in parallel disposed on the top surface of the substrate,
a medium layer sealing the plurality of LED chips and the top surface of the substrate into a sealed LED package,
two electrode wires, each electrode wire being extending out from one end of the substrate, two electrode wires being electrically connected to the plurality of LED chips,
wherein the plurality of LED chips are flatly packaged, and the sealed LED package is three-dimensionally shaped secondarily by a method selected from a group consisting of stretching, extruding, and die shaping to form the spiral LED packaging filament, and
the sealed LED package has a spiral shape;
the electrode wire of the spiral LED packaging filament is connected to the electrical connector via the drive; and
the bulb shell and the stem are respectively sealed.

10. The light bulb of claim 9, wherein a plastic bulb assembly is provided between the bulb shell and the electrical connector.

11. The light bulb of claim 9, wherein the substrate has a conical spiral shape or a regular spiral shape.

12. The light bulb of claim 9, wherein the LED chips are attached onto the substrate through transparent adhesive or conducting adhesive, and the transparent adhesive and/or the conducting adhesive is selected from a group consisting of silica gel, a modified resin adhesive, an epoxy resin adhesive, silver colloid and a copper adhesive.

13. The light bulb of claim 9, wherein the substrate is made from a material selected from a group consisting of metal, organic glass, plastic material and silica gel, all of which can be molding secondarily.

14. The light bulb of claim 9, wherein the plurality of LED chips have same color or different colors.

15. The light bulb of claim 9, wherein the medium layer is made from a material selected from a group consisting of silica gel, an epoxy resin adhesive and an LED luminescent powder adhesive.

16. The light bulb of claim 9, wherein the electrode wires are fixed at the two ends of the substrate through glue, a ceramic adhesive, low-melting-point glass, silver paste or plastic material, and a connection member is disposed between each electrode wire and a corresponding end of the substrate.

17. The light bulb of claim 9, wherein at least one spiral LED packaging filament operates with two-phase AC or single-phase DC; when the at least one spiral LED packaging filament is connected to operate with single-phase DC, an external DC power supply or an external AC power supply can be used.

18. A spiral LED packaging filament, comprising:
a substrate with a top surface and two ends;
a plurality of LED chips each connected in series or in parallel disposed on the top surface of the substrate;
a medium layer sealing the plurality of LED chips and the top surface of the substrate into a sealed LED package;
two electrode wires, each electrode wire being extending out from one end of the substrate, two electrode wires being electrically connected to the plurality of LED chips,
wherein the plurality of LED chips are first shaped in a spiral body, and then three-dimensionally packaged to form the spiral LED packaging filament, and
the sealed LED package has a spiral shape.

* * * * *

EX PARTE REEXAMINATION CERTIFICATE (11936th)

United States Patent
Zhang

(10) Number: US 10,066,791 C1
(45) Certificate Issued: Oct. 29, 2021

(54) SPIRAL LED FILAMENT AND LIGHT BULB USING SPIRAL LED FILAMENT

(71) Applicant: Tiehan Ge, Hangzhou (CN)

(72) Inventor: Xiaofeng Zhang, Yuyao (CN)

(73) Assignee: Tiehan Ge, Hangzhou (CN)

Reexamination Request:
No. 90/014,635, Dec. 21, 2020

Reexamination Certificate for:
Patent No.: 10,066,791
Issued: Sep. 4, 2018
Appl. No.: 15/039,739
PCT Filed: Nov. 27, 2014
PCT No.: PCT/CN2014/092330
§ 371 (c)(1),
(2) Date: May 26, 2016
PCT Pub. No.: WO2015/081804
PCT Pub. Date: Jun. 11, 2015

(30) Foreign Application Priority Data

Dec. 2, 2013 (CN) .......... 201310639668.6
Dec. 2, 2013 (CN) .......... 201320777826.X

(51) Int. Cl.
| | |
|---|---|
| *F21V 5/00* | (2018.01) |
| *F21K 9/232* | (2016.01) |
| *F21K 9/238* | (2016.01) |
| *F21K 9/237* | (2016.01) |
| *F21V 3/02* | (2006.01) |
| *F21V 19/00* | (2006.01) |
| *F21V 23/00* | (2015.01) |
| *F21V 23/06* | (2006.01) |
| *H01L 27/15* | (2006.01) |
| *H01L 33/20* | (2010.01) |
| *H01L 33/54* | (2010.01) |
| *H01L 33/56* | (2010.01) |
| *H01L 33/62* | (2010.01) |
| *F21Y 107/00* | (2016.01) |
| *F21Y 115/10* | (2016.01) |

(52) U.S. Cl.
CPC .............. *F21K 9/232* (2016.08); *F21K 9/237* (2016.08); *F21K 9/238* (2016.08); *F21V 3/02* (2013.01); *F21V 19/005* (2013.01); *F21V 23/005* (2013.01); *F21V 23/06* (2013.01); *H01L 27/15* (2013.01); *H01L 33/20* (2013.01); *H01L 33/54* (2013.01); *H01L 33/56* (2013.01); *H01L 33/62* (2013.01); *F21Y 2107/00* (2016.08); *F21Y 2115/10* (2016.08); *H01L 2924/0002* (2013.01)

(58) Field of Classification Search
None
See application file for complete search history.

(56) References Cited

To view the complete listing of prior art documents cited during the proceeding for Reexamination Control Number 90/014,635, please refer to the USPTO's public Patent Application Information Retrieval (PAIR) system under the Display References tab.

*Primary Examiner* — Deandra M Hughes

(57) ABSTRACT

A spiral LED packaging filament comprises a substrate, a plurality of LED chips disposed on the top surface of the substrate, a medium layer sealing the plurality of LED chips and the top surfaces of the substrate into a sealed LED package; two electrode wires being electric connected to the plurality of LED chips, wherein the sealed LED package has a spiral shape. A light bulb with the spiral LED packaging filament comprises a bulb shell; a stem having a supporting pole, an electrical wire and a stem exhaust pipe, at least one spiral LED packaging filament is fixed on the stem; the electrode wire is connected to the electrical connector via the drive; and the bulb shell and the stem are respectively sealed.

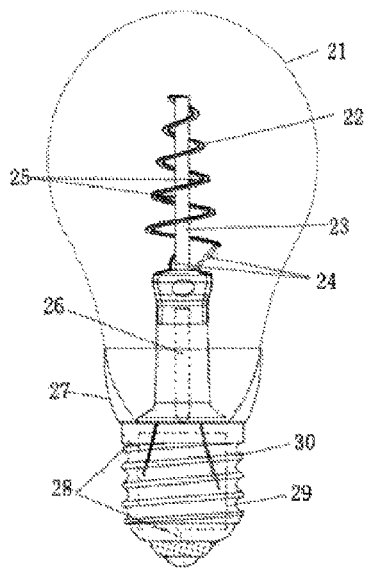

EX PARTE REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-8 and 18 are cancelled.

Claims 9-17 were not reexamined.

\* \* \* \* \*